(12) United States Patent
Basting et al.

(10) Patent No.: US 6,515,741 B1
(45) Date of Patent: Feb. 4, 2003

(54) OPTICAL DEVICE AND METHOD FOR LINE-NARROWED EXCIMER OR MOLECULAR FLUORINE LASER

(75) Inventors: Dirk L. Basting, Fort Lauderdale, FL (US); Sergei V. Govorkov, Boca Raton, FL (US)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/454,803

(22) Filed: Dec. 3, 1999

Related U.S. Application Data
(60) Provisional application No. 60/124,804, filed on Mar. 17, 1999.

(51) Int. Cl.[7] .............................................. G01N 21/00
(52) U.S. Cl. ...................... 356/237.1; 372/32; 372/102
(58) Field of Search ................................ 356/121, 124, 356/237.1, 237.2, 73.1, 480, 512; 372/102, 108, 92, 98, 27

(56) References Cited

U.S. PATENT DOCUMENTS

| | | | |
|---|---|---|---|
| 4,707,137 A | * 11/1987 | Lee | 356/353 |
| 5,015,096 A | * 5/1991 | Kowalski et al. | 356/124 |
| 5,218,421 A | * 6/1993 | Wakabayashi et al. | 372/32 |
| 5,559,816 A | * 9/1996 | Basting et al. | 372/27 |
| 5,835,520 A | 11/1998 | Das et al. | 372/57 |
| 6,101,211 A | * 8/2000 | Wakabayashi et al. | 372/102 |
| 6,317,203 B1 | * 11/2001 | Wakabayashi et al. | 356/237.1 |

FOREIGN PATENT DOCUMENTS

| | | |
|---|---|---|
| JP | 05283785 | * 10/1993 |
| JP | 411274632 | * 10/1999 |
| JP | 2000216464 | * 8/2000 |

* cited by examiner

*Primary Examiner*—Hoa Q. Pham
(74) *Attorney, Agent, or Firm*—Sierra Patent Group, Ltd.; Andrew V. Smith

(57) ABSTRACT

An apparatus and method for testing the quality of a line narrowing and/or selection module that has been particularly assembled for use with a line-narrowed excimer or molecular fluorine laser is described. The method includes providing a test beam which has been previously line-narrowed using an installed line-narrowing and/or selection module. Then, the test beam is directed into the test module. Next, the one or more properties of the retroreflected beam are measured, i.e., after the beam has traversed the test module. The quality of the test module and one or more of its components may be determined based on the measurements. Such properties as wavefront distortions, excessive scattering, total reflectivity, total dispersion and aging of components of the test module may be measured for making this quality determination.

71 Claims, 3 Drawing Sheets

OPTICAL DEVICE AND METHOD FOR LINE-NARROWED EXCIMER OR MOLECULAR FLUORINE LASER

PRIORITY

This application claims the benefit of priority to U.S. provisional patent application No. 60/124,804, filed Mar. 17, 1999.

BACKGROUND OF THE INVENTION

1. Field of the Invention

The invention relates to line-narrowed excimer and molecular fluorine lasers, and particularly to a technique for testing a linewidth narrowing and/or wavelength selection and wavelength tuning module of such a line-narrowed laser.

2. Discussion of the Related Art

A line-narrowed excimer or molecular fluorine laser used for microlithography provides an output beam with specified narrow spectral linewidth. It is desired that parameters of this output beam such as wavelength, linewidth, and energy and energy dose stabilty be reliable and consistent. Narrowing of the linewidth is generally achieved through the use of a linewidth narrowing and/or wavelength selection and wavelength tuning module (hereinafter "wavelength selector") consisting most commonly of prisms, diffraction gratings and, in some cases, optical etalons. The wavelength selector typically functions to disperse incoming light angularly such that light rays of the beam with different wavelengths are reflected at different angles. Only those rays fitting into a certain "acceptance" angle of the resonator undergo further amplification, and eventually contribute to the output of the laser system. Parameters of the wavelength selector such as the magnitude of angular dispersion, reflectivity for specific wavelengths, linearity (i.e. absence of wavefront distortions), scattering of the beam, etc., will thus affect the performance of the laser. Therefore, it is desired to avoid or minimize any variability in the quality of wavelength selector modules when such lasers are mass-produced.

In a conventional quality control procedure, a wavelength selector is first installed into the laser system, and then the performance of the laser is evaluated. The problem with this approach is that the performance of the laser is a complex function of many components, not only of the wavelength selector. Therefore, poor performance of the laser usually cannot be unambiguously traced to the wavelength selector. Additionally, even if it is determined that the wavelength selector is the cause of substandard laser performance, it is generally not easy to identify which parameter of the wavelength selector in particular presents a problem.

Wavelength selectors vary in their response to the exposure to high power laser beams that cause heating and aging of the optical components. For example, nonuniform heating of the optical elements of the wavelength selector may substantially degrade their quality by, for example, distorting the wavefront of the retroreflected beam. Again, the quality of the optical components, as well as the assembly of the components (which may cause mechanical stress, for example), determines the behavior of the wavelength selector under irradiation conditions encountered in a laser. It is desired to have a technique for observation of such radiation-induced distortions in real time and under controlled conditions.

SUMMARY OF THE INVENTION

It is a first object of the invention to provide a quality testing technique for minimizing any variability in the quality of line-narrowing and/or selection modules, or wavelength selectors, particularly for excimer or molecular fluorine lasers, and also for any line-narrowed laser system.

It is a second object of the invention to provide a quality testing technique in accord with the first object that is performed in real time and under controlled conditions.

A method is therefore provided in accord with the above objects for testing the quality of a line narrowing and/or wavelength selection/tuning module that has been assembled for use with a line-narrowed laser. The method includes providing a test beam which has been previously line-narrowed using an installed line-narrowing and/or wavelength selection/tuning module. Then, the test beam is directed into the test module. Next, the one or more properties of the retroreflected beam are measured, i.e., after the beam has traversed the test module. The quality of the test module and one or more of its components may be determined based on the measurements. Such properties as wavefront distortions, excessive scattering, total reflectivity, total dispersion and aging of components of, from or due to the test module are measured for making this quality determination. Advantageously, the method allows measurement of the "apparatus function" of the line-narrowing and/or wavelength selection module independently of the laser into which it is to be installed, thus giving a precise indication of the quality of the module and which properties or parameters, if any, are substandard.

An apparatus for testing the quality of a test linewidth narrowing and/or wavelength selection module that has been assembled for use with a line-narrowed laser includes the test module, a test laser having an installed line-narrowing and/or wavelength selection module for providing a line-narrowed test laser beam to be directed into the test module, and an observation device such as a detector for measuring one or more properties of the beam after the beam traverses the test module. A processor is preferably further provided for determining the quality of the test module based on the one or more measured properties.

DETAILED DESCRIPTION OF THE PREFERRED EMBODIMENT

Preferred and alternative embodiments of the present invention are described below. The present invention may be advantageously used for quality testing of line-narrowing and/or wavelength selection and tuning modules of excimer or molecular fluorine lasers such as KrF, ArF, KrCl, XeCl, XeF and $F_2$ lasers, and can also be used for evaluation of the line-narrowing modules of any line-narrowed laser such as dye, Ti:Sapphire, Cr:LiSAF or other lasers.

Figure 1:
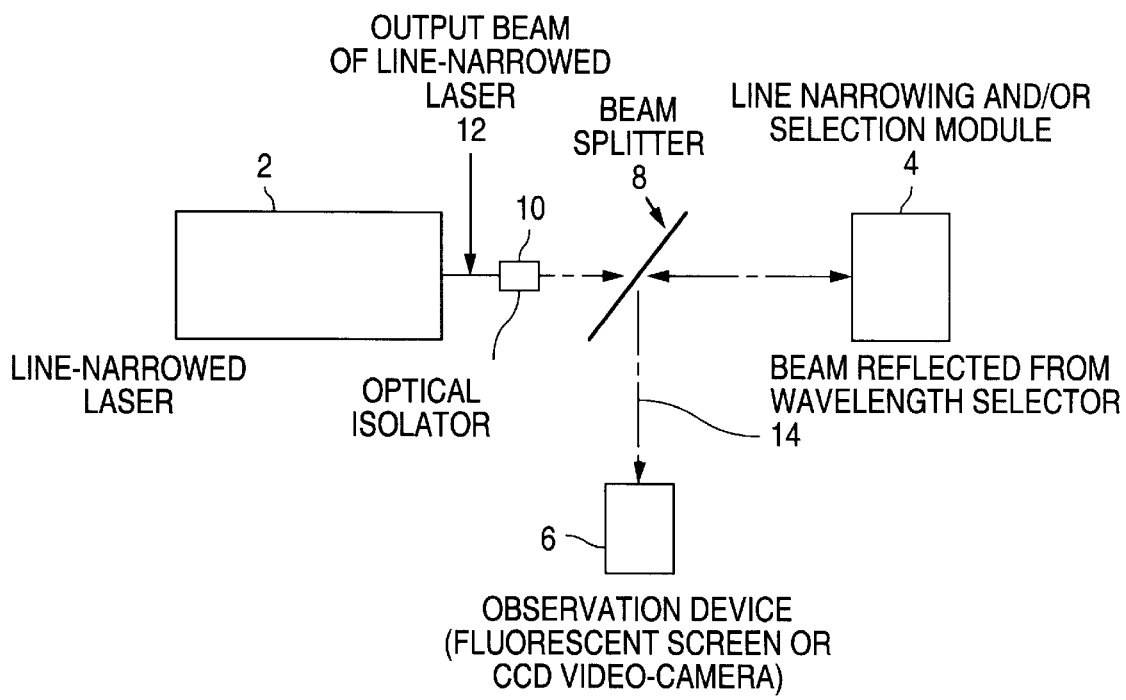
FIG. 1 schematically shows a first apparatus for testing the quality of a line-narrowing and/or wavelength selection module in accord with a preferred embodiment of the present invention.

FIG. 1 shows a first preferred embodiment in accord with the present invention. The apparatus shown in FIG. 1 in accord with the first preferred embodiment includes a line narrowed laser 2, a line narrowing, tuning and/or selection module 4 (hereinafter "wavelength selector 4") positioned outside of the resonator of the laser 2, an observation device 6, a beam splitter 8, and an optical isolator 10.

The line-narrowed laser 2 is preferably of the same type that the wavelength selector 4 is to be installed into if and when it passes the quality test of the invention. The line-narrowed laser 2 may be any of those set forth above, or another laser having a characteristically narrow output linewidth with or without additional line-narrowing and/or selection. The line narrowed laser 2 has its own installed wavelength selector that has preferably been previously quality tested, such that the laser 2 emits an output beam 12 that has reliable and consistent linewidth and wavelength.

The beam splitter 8 allows a portion of the beam 12 to transmit through it from left to right in FIG. 1, and a portion of the beam reflected from the wavelength selector 4 to reflect as it is incident from the right in FIG. 1. More than one beam splitter or one or more mirrors may also be used, as well as other conventional techniques for redirecting a laser beam.

The observation device 6 is preferably a CCD camera or a fluorescent screen when it is desired to measure properties of the beam dependent on the spatial profile or extent of the beam, such as wavefront distortions, scattering, or dispersion of the beam due to the wavelength selector 4. The observation device 6 may be an energy detector or power meter, e.g., to measure the total reflectivity or aging of the optical components of the wavlength selector 4. One skilled in the art would realize that other detectors could be used depending on the property of the beam that is to be measured. Various wavelength selectors 4 are described in detail below.

The optical isolator 10 is used in the embodiment of FIG. 1 to prevent the beam from reflecting back into the laser 2 and disturbing its operation. The optical isolator 10 may be any conventional device which allows a beam to pass in one direction relatively uninhibited and blocks a beam incident from the other direction. The optical isolator 10 may include a Faraday cell and two polarizers.

An output beam 12 from the line narrowed laser 2 passes completely or mostly uninhibited through the optical isolator 10. The beam 12 then also passes, at least in part, through the beam splitter 8 and continues into the wavelength selector 4. The beam is preferably retroreflected from the wavelength selector 4, as it would do if the wavelength selector 4 were installed in an operating laser. It is also possible to allow the beam to pass through the wavelength selector by removing or replacing its highly reflective component.

The retroreflected beam is then reflected, in part, by the beam splitter 8 and redirected to the observation device 6. Although not shown, a processor is preferably connected to the system, and preferably receives data from the observation device for processing and determination of the quality of the wavelength selector 4. The processor can also be used to vary the wavelength and linewidth of the beam reflected from wavelength selector 4. Alternative to using a processor for making such quality determinations, an output from the observation device 6 may be displayed on a screen for a user to observe and make the quality determination. A discriminator may also be used in conjunction with other electronics and/or the processor. The discriminator may, for example, discriminate based on angular distribution, level of divergent background or peak or total intensity of the output beam measured at the observation device.

Figure 2:
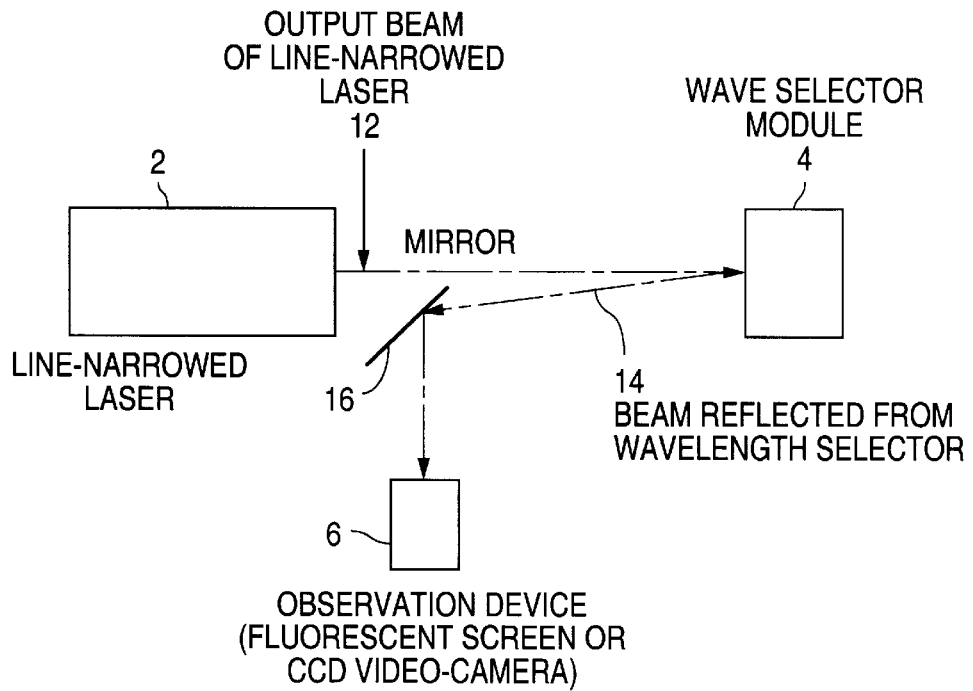
FIG. 2 schematically shows a second apparatus for testing the quality of a line-narrowing and/or wavelength selection module in accord with a preferred embodiment of the present invention.

FIG. 2 shows a second preferred configuration in accord with the present invention. The configuration of FIG. 2 is the same as that of FIG. 1, except the optical isolator 10 and beam splitter 8 are removed, and a mirror 16 is used. In this second configuration, the beam is reflected from the wavelength selector 4 at a small angle with respect to its incidence direction. In this way, the mirror 16 can be positioned so as not to block the output beam 12 of the laser 2, and yet to still reflect the beam 14 reflected from the wavelength selector 4. Fewer losses at the beam splitter 8 and optical isolator 10 are incurred in the second configuration, but the reflection of the beam 14 from the wavelength selector 4 at the small angle to the incoming beam 12 implies a small adjustment of the wavelength selector 4 from the setup of the first configuration of FIG. 1.

Figure 3:
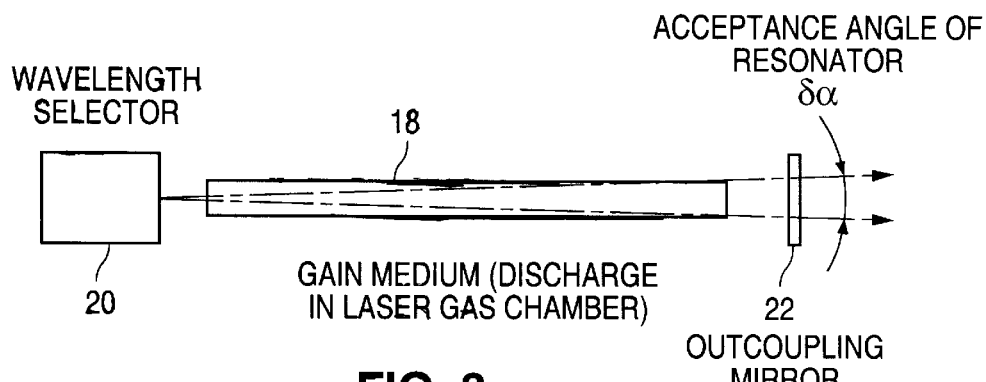
FIG. 3 schematically illustrates the principle of line-narrowing with an angularly dispersive line-narrowing and/or wavelength selection module.

In order to better understand the principle of the preferred method, an illustrative resonator of a line-narrowed laser is illustrated in FIG. 3. In the initial stages of laser pulse development, amplified spontaneous emission (ASE) generated in the gain medium 18 (gas discharge in case of excimer and molecular fluorine lasers) enters the wavelength selector 20. Since ASE has a broad spectrum, light dispersed in and reflected from the wavelength selector 20 emerges from the wavelength selector 20 at a multitude of angles in the plane of drawing, wherein the rays at each angle a have their respective wavelength λ on account of the dispersion. Ideally, the angle α is nearly a linear function of the wavelength λ, and the magnitude of angular dispersion $D=d\alpha/d\lambda$ is determined by the construction and components of the wavelength selector 20. Only the rays that fit within the resonator acceptance angle δα (determined by the discharge width and resonator length), are amplified and produce sizeable output on the first round-trip.

A portion of these rays is reflected back into the resonator by the outcoupling mirror 22, and those rays that re-enter the wavelength selector 20 are dispersed and selected again, thus providing second round-trip output. This process repeats several times until the end of the laser pulse. Each subsequent round-trip provides "cleaner" spectral output due to repeated selection processes, but the upper boundary δλ of the output linewidth is given by the first round-trip output, being equal to the ratio of acceptance angle and the angular dispersion:

$$\delta\lambda = \delta\alpha/(d\alpha/d\lambda).$$

The most common deviation from this process occurs due to the fact that light may be dispersed in non-linear and non-monotonic fashion. This will cause wavelength components that would normally be outside of the acceptance angle δα, to be amplified, thus causing broader output linewidth than desired.

There are several reasons for such behavior. One of them is wavefront distortions in the wavelength selector, and several others are described in more detail below, including excessive scattering in the wavelength selector 20, and aging of optical components making up the wavelength selector 20.

Figure 4:
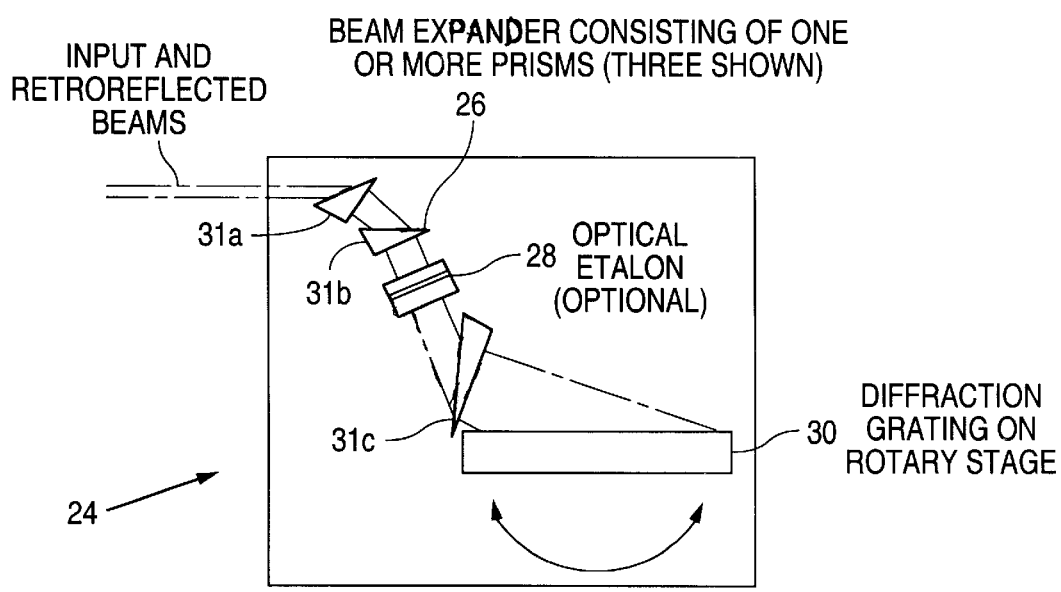
FIG. 4 schematically shows a high resolution line narrowing and/or wavelength selection module for testing in accord with the present invention.

FIG. 4 shows an exemplary wavelength selector 24. The wavelength selector 24 includes a beam expander 26, an etalon 28 and a diffraction grating 30. The beam expander 26 shown in FIG. 4 includes three prisms 31a, 31b and 31c. The beam expander 26 may include one or more prisms or other beam expanding optics such as a lens assembly or converging/diverging lens pair. The grating 30 is preferably rotatable so that the wavelengths reflected into the acceptance angle ba can be selected or tuned. The grating is typically used, particularly in KrF and ArF lasers, for achieving narrow bandwidths and also for retroreflecting the beam. Alternatively, a highly reflective mirror can be used to perform the reflective function performed by the grating 30 shown in FIG. 4. One or more dispersive prisms may also be used, and more than one etalon may be used.

Depending on the type and extent of line-narrowing and/or selection and tuning that is desired, and the particular laser that the wavelength selector is to be installed into, there are many alternative wavelength selector configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, 60/124,241, 60/140,532, and 60/140,531, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application.

Referring to FIG. 4, as the beam passes through the prisms of the beam expander 26, nonuniformities in the refractive index of the material or materials of the prisms, as well as nonflatness of the surfaces of the prisms, may cause deviations in the transmitted wavefront from an ideal plane shape. In this case, the incidence angles of rays of the beam incident on the diffraction grating will vary, thus causing variations of the reflection angles of rays along the length of the grating. This means that each particular wavelength component will be reflected at several angles, thus causing a reduction in output power at the desired wavelength. Also, several wavelength components will be reflected at each particular angle, and specifically within the acceptance angle $\delta\alpha$ of the resonator, causing a broadening of the bandwidth. Refractive index non-uniformities of the prism material, as well as surface non-flatness, may be intrinsic, due to manufacturing error, or induced by laser beam heating or long-term degradation, such as compaction.

Another source of distortions is non-flatness of the grating 30 itself, intrinsic or induced. Yet another source is non-constancy of the spatial frequency of the grooves of the grating 30 along its length. The etalon 28 can also be responsible for distortions, such as if the plate surfaces of the etalon 28 are varied from flat and parallel.

Below, some examples are described illustrating the significance of the effect of wavefront distortions for typical line-narrowed excimer lasers for microlithography. The acceptance angle of the resonator is typically $\delta\alpha=1$ mrad, given a resonator length of 1.5 m and an effective discharge width of 1.5 mm. In order to realize a spectral linewidth of 1.0 pm or less, the angular dispersion of the wavelength selector should be therefore 1 mrad/pm or more. Typically, such a wavelength selector 24 may utilize an echelle diffraction grating having a high blaze angle and a high reflection order. One such grating has groove density of 78.9 grooves per mm, a blaze angle of 78.6 degrees for a wavelength of 248.3 nm, and an angular dispersion of 0.04 mrad/pm. The eschelle type grating may be coupled with a prism beam expander having expansion ratio of 25, for example. Since the total dispersion is a product of the magnification and the angular dispersion of the grating, the total dispersion in this example is 25×0.04 =1, meeting the desired angular dispersion of the wavelength selector noted above.

In order to cause broadening of the linewidth by 20%, or 0.2 pm, the wavefront in the resonator would have distortions with a maximum tilt angle $\delta\Theta$ equal to:

$$\delta\Theta=0.2[pm]\times 1[mrad/pm]=0.2 \text{ mrad}.$$

This leads to wavefront tilt angles inside the wavelength selector between the grating and prism expander equal to $\delta\Theta/25=0.008$ mrad. With an expanded beam having a size of approximately 38 mm, this angular tilt converts into the equivalent of about one wavelength of distortion when that wavelength is 248 nm. For a double pass through expander, such as that illustrated at FIGS. 1–4 and discussed above, the distortion is doubled, and therefore, to keep the broadening at 20% or less due to the distortions, the maximum tilt angle can correspond to a distortion of only about $\lambda/2$ or less.

Typical manufacturing tolerances of the flat surfaces of the prisms is $\lambda/10$ when measured at the wavelength of the He—Ne laser (emitting around 633 nm). Therefore, five surfaces can, in principle, introduce wavefront distortions of $\lambda/2$ at 248 nm. Also, assuming the total length of the optical path through the prisms is approximately 5 cm, a maximum permissible amount of refractive index distortion, in keeping with the above stated exemplary criteria of having 20% or less broadening due to wavefront distortions, is about $4\times10^{-6}$ over the entire clear aperture of the prisms. Variations sufficient to cause the $4\times10^{-6}$ distortions and 20% broadening are not unusual in commercially available UV materials such as $CaF_2$, $MgF_2$ and fused silica.

Temperature distortions will typically cause an equivalent $2.5\lambda$/EC wavefront distortion tilt due to linear expansion. Temperature distortions will also typically cause an equivalent $-1.3\lambda$/EC wavefront distortion tilt due to temperature index variations. For calculating these values we used a temperature index variation of $-1.1\times10^{-5}$ per EK and a linear expansion coefficient of $18.7\times10^{-6}$ per EK for $CaF_2$.

Another source of distortions, as mentioned above, is variations of the groove density of the grating. The reflected angle N of the grating is described by this formula:

$$\sin N=m\lambda G/2,$$

where m is the diffraction order and G is linear groove density. For the sample grating described above, a variation of the reflection angle equal to 0.008 mrad would be caused by a variations in groove density as small as 1.1 parts per million (ppm). Such variations can be present due to manufacturing imperfections, or due to local heating of the grating by the laser beam. For example, even if a low thermal expansion material like Zerodur™ is utilized in the grating, a temperature gradient of 7 EC still will cause distortions of 1.1 ppm, for a given expansion coefficient of $0.15\times10^{-6}$/EK.

Additionally, small variations of the refractive index of the gas or gases filling the wavelength selector housing have been known to produce significant wavefront distortions. This is particularly so when there exists a turbulent flow or convection of such gas.

Roughness or contamination of the prism surfaces, or contamination and damage of the grating surface, can cause scattering of the laser beam within the wavelength selector.

The results of increased or excessive scattering typically are (a) intermixing of spectral components reflected within the acceptance angle of the resonator and thus, a broadening of the output emission spectrum of the laser; and (b) a reduced overall reflectivity of the wavelength selector leading to reduced output power of the laser.

Finally, total reflectivity, or throughput, of the wavelength selector is important for attaining specified output power of the laser. Throughput is determined by reflection losses and scattering at the prism surfaces, absorption in the bulk material of the prisms, and the reflectivity of the grating. Anti-reflective coatings on the prism surfaces may help minimizing reflective losses. However, such coatings may contribute to scattering and accelerated aging.

Summarizing the above considerations, there are many and various mechanisms that can lead to a degradation of the resolution of the wavelength selector. Therefore, the present application is particularly advantageous because it provides means for testing the quality of the wavelength selector directly, before installing it into laser, and thus allowing a more accurate determination of any deficiencies. Such testing should reveal static imperfections which are present intrinsically, as well as those induced by the incident laser beam, at one or more power levels comparable to those encountered in the laser for extended periods of time.

Now, applying what has been just described above to the optical layout of the proposed device as shown in FIGS. 1 and 2, many advantages of the present invention are realized. For example, the wavelength selector 4 is tested prior to installation of the wavelength selector 4 into an assembled laser, thereby permitting a more accurate assessment of any deficiencies, and saving time and ultimately cost, e.g., of installing a wavelength selector only to next find out that the wavelength selector is deficient.

The laser beam 12 of the line-narrowed laser 2 which is set to operate at a specified output emission wavelength and linewidth using its own, preferably processor-controlled, installed wavelength selector, is introduced into the wavelength selector 4 and then the angular intensity distribution of the retro-reflected beam is measured by the observation device 6, as described above. By lowering the power level of the test laser, e.g., to less than 1 Watt, one can perform a "static" test substantially for intrinsic distortions. By increasing the test beam power up to, e.g., 10 to 20 Watts, one can observe beam-induced distortions. As discussed above, the difference between the layouts in FIGS. 1 and 2 is that in FIG. 1, the beam is retroreflected perfectly back, whereas in FIG. 2, the beam is reflected back at a slight angle to the incident beam path. For better accuracy, losses at the optical isolator 10 (which may be nonetheless negligible), are figured into the quality determination when the layout of FIG. 1 is used, and changes in the profile of the reflected beam 14 due to the offset away from exact retroreflection (possible also negligible) are factored into the determination when the layout of FIG. 2 is used. Also in the layout of FIG. 2, the observation device may be positioned directly in the path of the reflected beam 14 such that the beam splitter 8 may be omitted from the layout. It is useful, but generally not necessary, to place the observation device 6 at an optical path distance from the wavelength selector 4 equal to the round-trip length of the resonator, for the reasons explained below.

Figure 5:
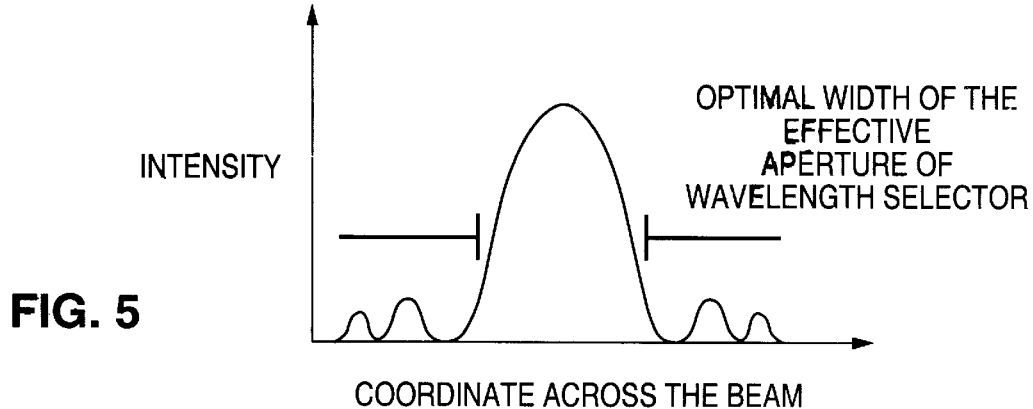
FIG. 5 illustrates an intensity distribution of a reflected beam caused by diffraction.

When the test laser 2 has output emission linewidth that is equal to or smaller than a desired resolution of the wavelength selector 4, the angular intensity distribution reflected from an ideal, or distortion-free, wavelength selector 4 will be dominated by (1) angular dispersion within the wavelength range determined by the test laser linewidth, and/or (2) diffraction effects. If the test laser 2 has a nearly uniform beam intensity, then the diffraction pattern is governed by well known in classical Fresnel (near-field) or Fraunhofer (far-field) diffraction from a hard aperture. A sample diffraction-limited, reflected beam intensity distribution from a properly designed wavelength selector is shown in FIG. 5. A reflected intensity distribution from such a wavelength selector should have most of its energy content in a single lobe, rather than distributed over two or more lobes, as the beam reenters the wavelength selector on the next round trip through the cavity. Additionally, the width of this intensity distribution should match the "acceptance aperture" of the wavelength selector, which is in turn determined in part by the sizes of its optical elements. This assures that the majority of the retroreflected beam will enter the wavelength selector on subsequent round-trips. These conditions provide for optimum laser efficiency at specified narrowed linewidths.

The diffraction-limited angular intensity distribution determines the apparatus function of the "ideal" wavelength selector. Presumably, such a distribution can only be measured with a perfectly monochromatic test laser. The presence of non-zero line broadening of the test laser will cause additional broadening of the diffraction-produced patter shown in FIG. 5. This effect is advantageously estimated in the present invention based on the angular dispersion of the wavelength selector so that an even more precise quality determination may be performed.

The diffraction-produced pattern of FIG. 5 in the case of an ideal wavelength selector and perfectly monochromatic test laser has a full-width at half maximum angular width $\Delta\theta_1$ of:

$$\Delta\theta_1 = 0.44\, \lambda/a,$$

where $\lambda$ is the laser wavelength and $a$ is the width of the hard aperture of the wavelength selector. In the presence of a non-zero bandwidth of the laser $\Delta\lambda$, the dispersion of the wavelength selector will cause additional broadening $\Delta\theta_2$:

$$\Delta\theta_2 = \Delta\lambda \cdot (d\nabla/d\lambda),$$

where $(d\nabla/d\lambda)$ is the spectral dispersion. The total width of the ideal wavelength selector $\Delta\theta$ where the test laser emits a beam having a non-zero bandwidth is estimated as:

$$\Delta\theta = (\Delta\theta_1^2 + \Delta\theta_2^2)^{1/2}.$$

In the presence of additional broadening $\Delta\theta_3$ caused by wavefront distortions, the total width of the distrubution produced by a real wavelength selector is:

$$\Delta\theta = (\Delta\theta_1^2 + \Delta\theta_2^2 + \Delta\theta_3^2)^{1/2}.$$

As long as the linewidth of the test laser 2 does not substantially exceed the desired linewidth of a typical production laser, the broadening factor is subtracted accurately from the results of the measurements, in order to isolate the effects caused by the imperfections of the tested wavelength selector. Any additional broadening of the reflected intensity distribution may be caused solely by effects of distortions in the wavelength selector 4, as described above. This additional broadening is compared with a maximum acceptable level of broadening determined for the particular laser wherein the wavelength selector 4 is to be later installed.

The maximum acceptable level of broadening is typically determined primarily by the acceptance angle of the resonator of the laser where the wavelength selector is to be later installed. For example, the measured total width )2 can be used to determine the broadening )2N caused only by diffraction and wavefront distortions:

$$)2N = ()2^2 - )2_2^2)^{1/2}.$$

Then, )2N is compared with the resonator acceptance angle *∀, as shown in and discussed with respect to FIG. 3. If on comparison, it is determined that )2N>*∀, then the wavelength is deemed unsatisfactory and will not be installed in its present condition into a laser.

Figure 6:
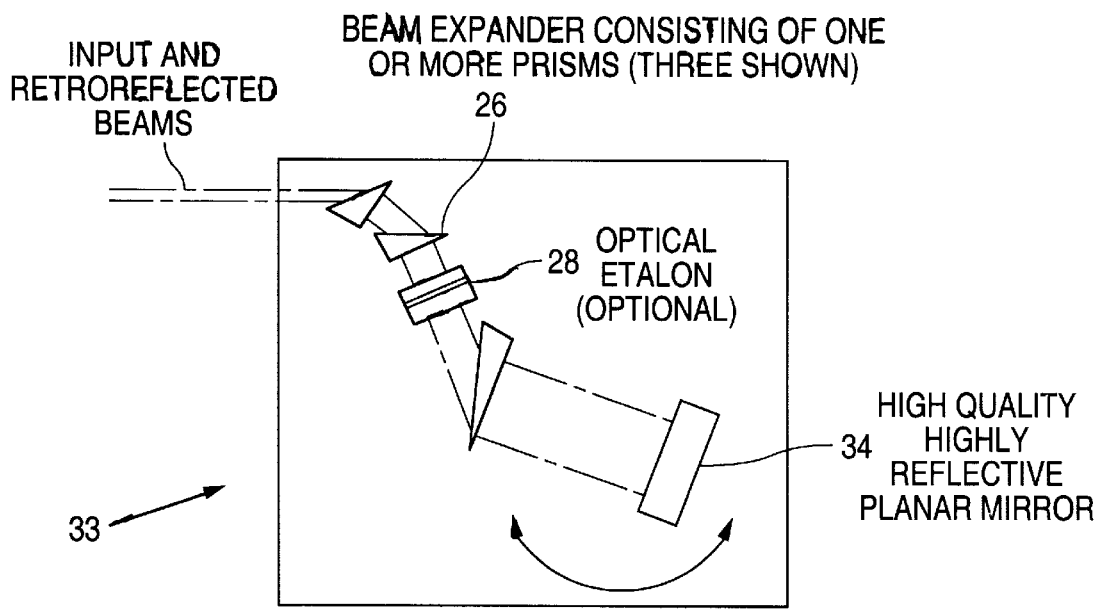
FIG. 6 schematically shows the module of FIG. 4, wherein the dispersive grating has been replaced with a highly reflective mirror.

As illustrated in FIG. 6, the present invention further advantageously allows an operator of the wavelength selector quality test according to the present invention to separate out contributions due to one of the components of the wavelength selector 4, such as separating efffects from the grating 30 from those of the prisms 31a–31c of the beam expander 26 and other factors. This separation or isolation of effects of certain components of the wavelength selector 24, in this example the grating 30, is achieved by substituting a high quality plane mirror 34 for the grating 30 to achieve the alternative wavelength selector layout 33 shown in FIG. 6.

A high quality mirror 34 can be selected, e.g., having surface distortions of less than λ/20 and a high reflectivity coating at the test wavelength. The mirror 34 should be aligned so that it retroreflects the beam just like the grating 30 of FIG. 4. The difference between the mirror 34 and the grating 30 is that the mirror 34 produces no dispersion, and reliably causes very small distortion effects. Since the mirror 34 introduces only minor wavefront distortion due to its high degree of planarity, the effects of groove density variations or surface non-planarity of the grating 30, as described above, are eliminated from the test. In addition, effects caused by heating of the mirror 34 by the incident beam are negligible, provided that the coating is highly reflective and the substrate of the mirror 34 is made of highly transparent material at the test wavelength. All of these advantages allow a more precise quality determination of the other elements of the wavelength selector 33.

It is also possible to test other components of the wavelength selector 24 with increased precision in a similar manner. For example, one or more prisms and/or the etalon may be removed, possibly even including the replacement of the grating 30 with the mirror 34, and the quality of the other prisms and/or the grating and/or etalon may be determined more precisely.

Some of the particular features of quality determination in accord with the method and apparatus of the present invention are summarized below:

1. Tests of wavefront distortions, both static and laser-induced may be performed. Such distortions are detected as a broadening of the reflected beam profile beyond the broadening caused by diffraction and the non-zero linewidth of the test laser.
2. Tests of excessive scattering of the beam in the wavelength selector may be observed as either a broadening of the reflected beam, or as a presence of a highly divergent "background" of reflected light.
3. Tests of total reflectivity of the wavelength selector can be measured as the ratio of the powers of the beams incident upon and reflected from the wavelength selector. In these tests, it is useful to use a power meter or energy detector, such as a diode detector or photomultiplier tube, as the observation device 6 of FIGS. 1 and 2.
4. Tests of the magnitude of dispersion of the wavelength selector can be measured as the ratio of the angular displacement of the reflected beam to the amount of the wavelength change, as the test laser is wavelength-tuned.
5. Tests of effects of aging of optical components of the wavelength selector when exposed to high power laser irradiation. One common effect is compaction in fused silica causing refractive index distortions. Another example is degradation of the aluminum coating of the grating causing its reflectivity to decrease.
6. Tests can be performed wherein a high quality, highly reflective mirror 34 is substituted for the grating 30 in order to isolate effects caused by the grating.

Figure 7:
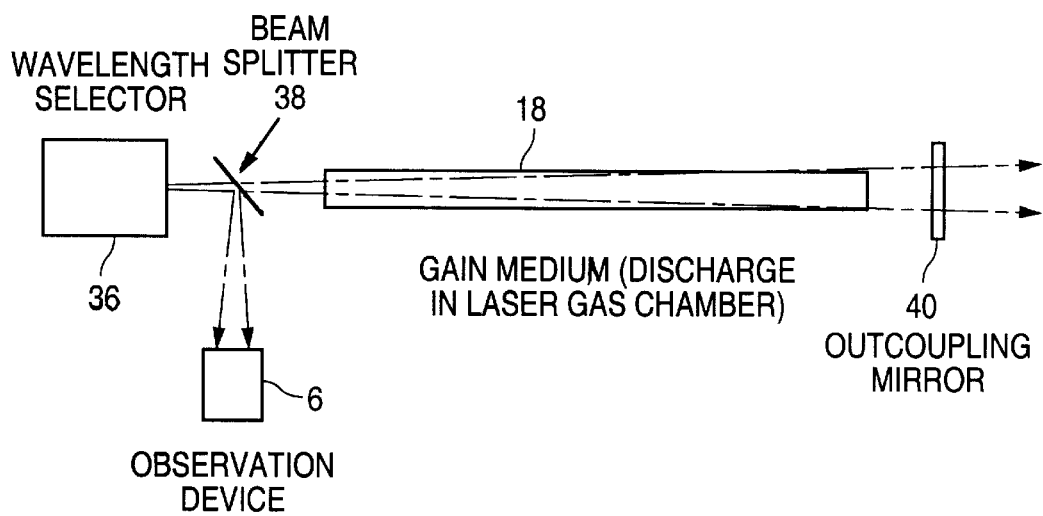
FIG. 7 schematically shows an alternative embodiment of the invention wherein the line-narrowing and/or wavelength selection module to be tested is installed in an operating laser.

FIG. 7 shows a possible alternative to the preferred setups of FIGS. 1 and 2. In this case, a wavelength selector 36 is installed into a laser system to be used for industrial operation. The laser includes a gain medium 18 and outcoupler 40 as shown. Reference is made to the above patents and patent applications for variations on the laser set up shown in FIG. 7. A beam splitter 38 is placed just after the wavelength selector 36 between the wavelength selector 36 and the gain medium 18. The beam splitter 38 reflects the beam reflected from the wavelength selector to the observation device 6.

The advantage of wavelength quality testing according to this alternative embodiment is that a portion of the light reflected from a wavelength selector installed in a working laser is split off. However, in this alternative case, imperfections of the wavelength selector 36 can cause the laser to operate with an unpredictably broader or otherwise odd-shaped emission profile or spectral distribution, or at a lower power, or with a distorted beam, and quality determinations of the wavelength selector 36 based on the measurements by the observation device 6 are more difficult to make than with the preferred arrangements of FIGS. 1 and 2.

The objects of the invention set forth above are met by the present invention as described herein. The invention provides means of evaluating the quality of a wavelength selector of a line-narrowed laser, such as an excimer or molecular fluorine laser. This evaluation enables input quality control of wavelength selectors in mass-production of such lasers, as well as greatly simplified troubleshooting of failed components.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

What is claimed is:

1. A method for testing the quality of a test linewidth narrowing and/or wavelength selection and wavelength tuning module that has been assembled for later use with a line-narrowed laser, comprising the steps of:

providing a laser test beam which is previously line-narrowed using an installed line-narrowing and/or selection module and is tuned approximately to a predetermined central wavelength;

directing said line-narrowed laser test beam at said test module, which test module is also tuned to select a spectral distribution with maximum selectivity at approximately said predetermined central wavelength; and measuring one or more parameters of said beam after said beam has traversed said test module.

2. The method of claim 1, further comprising the step of determining the quality of said test module based on said one or more measured parameters.

3. The method of claim 2, further comprising the step of factoring into the determination the nonzero bandwidth of the line-narrowed laser test beam.

4. The method of claim 1, wherein said testing method is performed before said test module is installed into a laser resonator.

5. The method of claim 1, wherein said installed module and said test module are different modules.

6. The method of claim 1, wherein a measured parameter is angular distribution of said beam.

7. The method of claim 6, further comprising the step of determining a level of wavefront distortions associated with said test module based on the measured angular distribution.

8. The method of claim 7, wherein the test laser is set to low power, and the level of intrinsic wavefront distortions is determined.

9. The method of claim 7, wherein the test laser is set to high power, and the level of beam-induced wavefront distortions is determined.

10. The method of claim 6, further comprising the step of determining a level of scattering by said test module based on the measured angular distribution.

11. The method of claim 1, wherein a measured parameter is energy of said beam.

12. The method of claim 11, further comprising the step determining total reflectivity of said test module based on the measured energy.

13. The method of claim 12, further comprising the step of determining effects of aging of optical components of the test module based on the total reflectivity.

14. The method of claim 12, wherein said test laser is set to low power, and the step of determining the effects of aging includes determining the effects of static aging of the optical components.

15. The method of claim 12, wherein the test laser is set to high power, and the step of determining the effects of aging includes determining the effects of beam-induced aging of the optical components.

16. A method for testing the quality of a test linewidth narrowing and/or wavelength selection and wavelength tuning module that has been assembled for later use with a line-narrowed laser, comprising the steps of:

providing a laser test beam which is previously line-narrowed using an installed line-narrowing and/or selection module;

directing said line-narrowed laser test beam at said test module; and measuring one or more parameters of said beam after said beam has traversed said test module, and wherein a measured parameter is angular distribution of said beam, the method further comprising the steps of tuning the output wavelength of the test module and determining the total dispersion of said test module based on the measured angular distribution versus wavelength.

17. A method for testing the quality of a test linewidth narrowing and/or wavelength selection and wavelength tuning module that has been assembled for later use with a line-narrowed laser, comprising the steps of:

providing a laser test beam which is previously line-narrowed using an installed line-narrowing and/or selection module;

directing said line-narrowed laser test beam at said test module; and measuring one or more parameters of said beam after said beam has traversed said test module, the method further comprising the step of selectively removing a dispersive component of said test module to isolate effect caused by said dispersive component on said one or more measured parameters, wherein said measuring step includes measuring effect on said one or more parameters of a beam expander of said test module.

18. The method of claim 17, wherein said dispersive component is a grating, said method further comprising the step of substituting a highly reflective mirror for the removed grating.

19. A method for testing the quality of a test linewidth narrowing and/or wavelength selection and wavelength tuning module that has been assembled for later use with a line-narrowed laser, comprising the steps of:

providing a laser test beam which is previously line-narrowed using an installed line-narrowing and/or selection module;

directing said line-narrowed laser test beam at said test module; and measuring one or more parameters of said beam after said beam has traversed said test module, the method further comprising the step of selectively removing a beam expanding component of said test module to isolate effect caused by said beam expanding component on said one or more measured parameters, wherein said measuring step includes measuring effect on said one or more parameters of one or more of a second beam expanding component and a dispersive element of said test module.

20. An apparatus for testing the quality of a test linewidth narrowing and/or selection and wavelength tuning module that has been assembled for later use with a line-narrowed laser, comprising:

a test laser having an installed line-narrowing and/or wavelength selection and wavelength tuning module for providing a line-narrowed test laser beam, tuned approximately to a predetermined central wavelength, to be directed at said test module, which test module is also tuned to select a spectral distribution with maximum selectivity at approximately said predetermined central wavelength; and an observation device for measuring one or more parameters of said beam after said beam traverses said test module.

21. The apparatus of claim 20, further comprising a processor for determining the quality of said test module based on said one or more measured parameters.

22. The apparatus of claim 21, wherein said processor factors into the determination the nonzero bandwidth of the line-narrowed laser test beam.

23. The apparatus of claim 20, wherein said test module is located outside of any laser resonator into which the test module is to be later installed.

24. The apparatus of claim 20, wherein said installed module and said test module are different modules.

25. The apparatus of claim 20, wherein said observation device is configured to measure the angular distribution of said beam.

26. The apparatus of claim 25, further comprising a processor for determining a level of wavefront distortions associated with said test module based on the measured angular distribution.

27. The apparatus of claim 26, wherein the test laser is set to low power for determining the level of intrinsic wavefront distortions.

28. The apparatus of claim 26, wherein the test laser is set to high power for determining the level of beam-induced wavefront distortions.

29. The apparatus of claim 25, further comprising a processor for determining a level of scattering by said test module based on the measured angular distribution.

30. The apparatus of claim 20, wherein said observation device is configured to measure the energy of said beam.

31. The apparatus of claim 30, further comprising a processor for determining total reflectivity of said test module based on the measured energy.

32. The apparatus of claim 30, wherein said test laser is set to low power for determining the level of intrinsic effects of aging of optical components of the test module.

33. The apparatus of claim 30, wherein said test laser set to high power for determining the level of beam-induced effects of aging of optical components of the test module.

34. The apparatus of claim 20, wherein said test module comprises fewer than all optical components that said installed module comprises to isolate effect caused by one or more components on said one or more measured properties.

35. The apparatus of claim 20, wherein said test module comprises one or more from the group consisting of a highly reflective mirror, an etalon, and one or more prisms.

36. The apparatus of claim 20, wherein said line-narrowed laser that said test module has been assembled for later use with is a KrF-excimer laser.

37. The apparatus of claim 20, wherein said line-narrowed laser that said test module has been assembled for later use with is an ArF-excimer laser.

38. The apparatus of claim 20, wherein said line-narrowed laser that said test module has been assembled for later use with is a $F_2$ laser.

39. The apparatus of claim 20, wherein said test laser beam has a wavelength selected from the group consisting of around 248 nm, 193 nm and 157 nm.

40. The apparatus of claim 20, wherein said observation device comprises a CCD camera.

41. The apparatus of claim 20, wherein said observation device comprises a fluorescent screen.

42. The apparatus of claim 20, wherein said observation device comprises a power meter.

43. An apparatus for testing the quality of a test linewidth narrowing and/or selection and wavelength tuning module that has been assembled for later use with a line-narrowed laser, comprising:
   a test laser having an installed line-narrowing and/or wavelength selection and wavelength tuning module for providing a line-narrowed test laser beam to be directed at said test module; and
   an observation device for measuring one or more parameters of said beam after said beam traverses said test module, and
   wherein said observation device is configured to measure the angular distribution of said beam, the apparatus further comprising a processor for determining the total dispersion of the test module based on the measured angular distribution versus wavelength.

44. An apparatus for testing the quality of a test linewidth narrowing and/or selection and wavelength tuning module that has been assembled for later use with a line-narrowed laser, comprising:
   a test laser having an installed line-narrowing and/or wavelength selection and wavelength tuning module for providing a line-narrowed test laser beam to be directed at said test module; and
   an observation device for measuring one or more parameters of said beam after said beam traverses said test module, and
   wherein said test module comprises one or more from the group consisting of a grating, an etalon, and one or more prisms.

45. A system for evaluating the quality of at least one component in a module for narrowing the bandwidth of a laser beam, comprising:
   a laser for generating an output beam having an approximately known bandwidth and central wavelength, said output beam being directed to interact with the module which is tuned to select a spectral distribution with maximum selectivity at approximately said known central wavelength of said laser; and
   a detector for measuring a parameter of the output beam after it has interacted with the module, said detector generating an output signal which corresponds to the quality of the component in the module.

46. The system of claim 45, further comprising a processor for determining the quality of said module based on said measured parameters.

47. The system of claim 46, wherein said processor factors into the determination the nonzero bandwidth of the laser beam.

48. The system of claim 45, wherein said detector is configured to measure the angular distribution of said beam.

49. The system of claim 48, further comprising a processor for determining a level of wavefront distortions associated with said module based on the measured angular distribution.

50. The system of claim 49, wherein the laser is set to low power for determining the level of intrinsic wavefront distortions.

51. The system of claim 49, wherein the laser is set to high power for determining the level of beam-induced wavefront distortions.

52. The system of claim 48, further comprising a processor for determining a level of scattering by said module based on the measured angular distribution.

53. The system of claim 45, wherein said detector is configured to measure the energy of said beam.

54. The system of claim 53, further comprising a processor for determining total reflectivity of said module based on the measured energy.

55. The system of claim 53, wherein said laser is set to low power for determining the level of intrinsic effects of aging of optical components of the module.

56. The system of claim 53, wherein said laser is set to high power for determining the level of beam-induced effects of aging of optical components of the module.

57. A system for evaluating the quality of at least one component in a module for narrowing the bandwidth of a laser beam, comprising:
   a laser for generating an output beam having a known bandwidth, said output beam being directed to interact with the module; and
   a detector for measuring a parameter of the output beam after it has interacted with the module, said detector generating an output signal which corresponds to the quality of the component in the module, and
   wherein said detector is configured to measure the angular distribution of said beam, the system further comprising a processor for determining the total dispersion of the test module based on the measured angular distribution versus wavelength.

58. A system for evaluating the quality of at least one component in a module for narrowing the bandwidth of a laser beam comprising:

a laser for generating an output beam having an approximately known bandwidth and central wavelength, said output beam being directed to interact and reflect from the module which is tuned to select a spectral distribution with maximum selectivity at approximately said known central wavelength of said laser; and a detector for measuring the angular distribution of the reflected output beam, with the angular distribution corresponding to the quality of the component in the module.

59. The system of claim 58, further comprising a processor for determining the quality of said module based on said measured angular distribution.

60. The system of claim 58, further comprising a processor for determining a level of wavefront distortions associated with said module based on the measured angular distribution.

61. The system of claim 60, wherein the laser is set to low power for determining the level of intrinsic wavefront distortions.

62. The system of claim 60, wherein the laser is set to high power for determining the level of beam-induced wavefront distortions.

63. The system of claim 58, further comprising a processor for determining a level of scattering by said test module based on the measured angular distribution.

64. A system for evaluating the quality of at least one component in a module for narrowing the bandwidth of a laser beam comprising:

a laser for generating an output beam having a known bandwidth, said output beam being directed to interact and reflect from the module; and a detector for measuring the angular distribution of the reflected output beam, with the angular distribution corresponding to the quality of the component in the module, the system further comprising a processor for determining the total dispersion of the module based on the measured angular distribution versus wavelength.

65. A system for evaluating the quality of at least one component in a module for narrowing the bandwidth of a laser beam comprising:

a laser for generating an output beam having an approximately known bandwidth and central wavelength, said output beam being directed to interact with the module which is tuned to select a spectral distribution with maximum selectivity at approximately said known central wavelength of said laser; and a detector for measuring the angular distribution of the output beam, with the angular distribution corresponding to the quality of the component in the module.

66. The system of claim 65, further comprising a processor for determining the quality of said module based on said measured angular distribution.

67. The system of claim 65, further comprising a processor for determining a level of wavefront distortions associated with said module based on the measured angular distribution.

68. The system of claim 67, wherein the laser is set to low power for determining the level of intrinsic wavefront distortions.

69. The system of claim 67, wherein the laser is set to high power for determining the level of beam-induced wavefront distortions.

70. The system of claim 65, further comprising a processor for determining a level of scattering by said test module based on the measured angular distribution.

71. A system for evaluating the quality of at least one component in a module for narrowing the bandwidth of a laser beam comprising:

a laser for generating an output beam having a known bandwidth, said output beam being directed to interact with the module; and a detector for measuring the angular distribution of the output beam, with the angular distribution corresponding to the quality of the component in the module, the system further comprising a processor for determining the total dispersion of the module based on the measured angular distribution versus wavelength.

* * * * *